US006436818B1

(12) United States Patent
Hu et al.

(10) Patent No.: US 6,436,818 B1
(45) Date of Patent: *Aug. 20, 2002

(54) SEMICONDUCTOR STRUCTURE HAVING A DOPED CONDUCTIVE LAYER

(75) Inventors: Yongjun Hu; Pai-Hung Pan; Er-Xuan Ping; Randhir P. S. Thakur; Scott DeBoer, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,115

(22) Filed: Dec. 6, 1999

Related U.S. Application Data

(62) Division of application No. 08/803,174, filed on Feb. 19, 1997, now Pat. No. 6,015,997.

(51) Int. Cl.[7] .............................................. H01L 29/76
(52) U.S. Cl. ........................ 438/656; 438/584; 438/653; 438/655; 257/57; 257/66; 257/324; 257/325; 257/412; 257/431
(58) Field of Search ........................... 257/57, 66, 324, 257/325, 412, 431; 438/584, 592, 653, 655, 656

(56) References Cited

U.S. PATENT DOCUMENTS

| 4,755,865 A | 7/1988 | Wilson et al. ................ 357/63 |
| 4,774,204 A | 9/1988 | Havemann .................... 437/54 |
| 4,784,973 A | 11/1988 | Stevens et al. ............. 437/200 |
| 4,788,160 A | 11/1988 | Havemann et al. ......... 437/200 |
| 4,897,368 A | 1/1990 | Kobushi et al. ............ 437/200 |
| 4,912,542 A | 3/1990 | Suguro ........................ 357/67 |

(List continued on next page.)

FOREIGN PATENT DOCUMENTS

EP          0746015      12/1996      ....... H01L/21/3065

OTHER PUBLICATIONS

Beyers, R., et al., "Titanium disilicide formation on heavily doped silicon substrates", *Journal of Applied Physics*, vol. 61, No. 11, 5110–5117, (Jun. 1, 1987).

Hosoya, T., et al., "A Polycide Gate Electrode with a Conductive Diffusion Barrier Formed with ECR Nitrogen Plasma for Dual Gate CMOS", *IEEE Transactions on Electron Devices*, 42, No. 12, pp. 2111–2116, (Dec. 1995).

Ito, T., et al., "A Nitride–Isolated Molybdenum–Polysilicon Gate Electrode for MOS VLSI Circuits", *IEEE Transactions on Electron Devices*, vol. ED–33, No. 4, 464–468, (Apr. 1986).

(List continued on next page.)

*Primary Examiner*—Charles Bowers
*Assistant Examiner*—Lisa Kilday
(74) *Attorney, Agent, or Firm*—Schwegman, Lundberg, Woessner & Kluth, P.A.

(57) ABSTRACT

Methods and apparatus for forming word line stacks comprise one, or a combination of the following: a silicon diffusion barrier layer, doped with oxygen or nitrogen, coupled between a bottom silicon layer and a conductor layer; an amorphous silicon diffusion barrier coupled between a polysilicon layer and a conductor layer; a thin nitride layer coupled between a bottom silicon layer and a titanium silicide conductor layer, and a bottom silicon layer coupled to a conductor layer, which comprises C54-titanium silicide. Word line stacks formed by the methods of the invention are used in sub-0.25 micron line width applications and have a lower resistivity and improved thermal stability.

17 Claims, 14 Drawing Sheets

U.S. PATENT DOCUMENTS

| | | | |
|---|---|---|---|
| 4,923,822 A | 5/1990 | Wang et al. | 437/41 |
| 4,935,804 A | 6/1990 | Ito et al. | 357/71 |
| 5,210,043 A | 5/1993 | Hosaka | 437/30 |
| 5,234,794 A | 8/1993 | Sebald et al. | 430/325 |
| 5,381,302 A | 1/1995 | Sandhu et al. | 361/305 |
| 5,395,787 A | 3/1995 | Lee et al. | 437/57 |
| 5,397,744 A | 3/1995 | Sumi et al. | 437/200 |
| 5,534,713 A | 7/1996 | Ismail et al. | 257/24 |
| 5,541,131 A | 7/1996 | Yoo et al. | 437/44 |
| 5,545,574 A | 8/1996 | Chen et al. | 437/40 |
| 5,545,581 A | 8/1996 | Armacost et al. | 437/52 |
| 5,569,947 A | 10/1996 | Iwasa et al. | 257/336 |
| 5,624,869 A | 4/1997 | Agnello et al. | 438/602 |
| 5,633,200 A | 5/1997 | Hu | 438/653 |
| 5,650,648 A | 7/1997 | Kapoor | 257/316 |
| 5,656,546 A | 8/1997 | Chen et al. | 438/586 |
| 5,665,646 A | 9/1997 | Kitano | 438/592 |
| 5,668,394 A * | 9/1997 | Lur et al. | 257/413 |
| 5,682,055 A | 10/1997 | Huang et al. | 257/408 |
| 5,710,438 A | 1/1998 | Oda et al. | 257/69 |
| 5,723,893 A | 3/1998 | Yu et al. | 257/413 |
| 5,726,479 A | 3/1998 | Matsumoto et al. | 257/412 |
| 5,728,625 A | 3/1998 | Tung | 438/586 |
| 5,739,064 A | 4/1998 | Hu et al. | 438/528 |
| 5,796,151 A | 8/1998 | Hsu et al. | 257/410 |
| 5,856,698 A | 1/1999 | Hu et al. | 257/412 |
| 5,874,351 A | 2/1999 | Hu et al. | 438/527 |
| 5,874,353 A | 2/1999 | Lin et al. | 438/592 |
| 5,945,719 A | 8/1999 | Tsuda | 257/413 |

OTHER PUBLICATIONS

Kobushi, K., et al., "A High Integrity and Low Resistance Ti–Polycide Gate Using a Nitrogen Ion–Implanted Buffer Layer", *Japanese Journal of Applied Physics/Part 2: Letters*, 27, No. 11, pp. L2158–L2160, (Nov. 1988).

Pan, P., et al., "Highly Conductive Electrodes for CMOS", *Proc. of the international symposium on ULSI Sci & Tech*, ECS, Inc., Pennington, NJ, 104–109, (1989).

Shimizu, S., et al., "0.15um CMOS Process for High Performance and High Reliability", *IEEE*, pp. 4.1.1–4.1.4, (1994).

* cited by examiner

SEMICONDUCTOR STRUCTURE HAVING A DOPED CONDUCTIVE LAYER

This application is a divisional of U.S. Ser. No. 08/803,174 filed Feb. 19, 1997 now U.S. Pat. No. 6,015,997.

FIELD OF THE INVENTION

The present invention relates to the manufacture of semiconductor devices, and in particular, to the manufacture of gate structures utilized in advanced semiconductor products.

BACKGROUND

Semiconductor memory devices are comprised of an array of memory cells. Each memory cell comprises a capacitor, on which the charge stored represents the logical state of the memory cell. A charged capacitor corresponds to a logical state of "1" and an uncharged capacitor corresponds to a logical state of "0." Word lines activate access transistors, so that the logical state of a memory cell can be read. Gates of multiple transistors are formed as one word line.

An example of a word line's application is in a dynamic random access memory-(DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer as a two-layer stack, comprising silicon (or polysilicon), coated with a conductor material. The most common two-layer stack used in the industry is a layer of polysilicon, coated with a tungsten silicide layer. Tungsten silicide is used because of its good integration properties, such as providing good thermal stability, stability during source/drain oxidation, and stability during dry etching, as well as having a low resistivity. Although titanium silicide is approximately 75% less resistive than tungsten silicide, it has not been used extensively in two-layer stacks because it is not as thermally stable. Titanium silicide tends to agglomerate during subsequent high temperature processing steps. Alternatively, a metal is used instead of a silicide for the conductor layer.

Of primary concern is minimizing resistivity throughout the word line, due to the need to reduce RC time constants and access multiple memory cells in as short a period of time as possible. The problem is especially critical due to the extended length of word lines. Diffusion of silicon from the bottom polysilicon layer to the top conductor layer increases the resistivity of the two-layer stack. When silicon diffuses through the stack, it reacts with the conductor layer elements, increasing the resistivity of the conductor layer. When the conductor layer is formed of a metal, silicides are formed, which have a higher resistivity than pure metal.

One previous unsuccessful attempt to solve this diffusion problem introduces a third layer, which acts as a diffusion barrier, between the silicon and conductor layers. For example, a silicon nitride layer is used as the third layer in a two-layer stack. However, the silicon nitride diffusion barrier layer of Ito et al. (IEEE Transactions on Electron Devices, ED-33 (1986), 464 and U.S. Pat. No. 4,935,804) is difficult to employ because it must be ultrathin (less than 3 nanometers thick) to allow tunneling of charges through the layer, yet thick enough to act as a reaction barrier between the polysilicon and conductor layer elements.

Another diffusion barrier used in the past comprises a titanium nitride layer interposed between a two-layer stack. The conductive titanium nitride barrier layer of Pan et al. (IBM General Technology Division, "Highly Conductive Electrodes for CMOS") attempts to solve the problems of Ito et al., but it requires a special source/drain (S/D) oxidation process when forming oxide spacers to maintain gate oxide layer integrity. A special process is required due to the tendency for tungsten and titanium nitride to oxidize, resulting in degradation of these layers. This adds time and cost to the fabrication process.

In ultra large scale integrated (ULSI) circuits, a highly conductive word line is necessary to improve circuit density and performance. In order to maintain a highly conductive word line, it is necessary to provide an effective method for decreasing diffusion within the two-layer stack. As devices are scaled down in size, word line widths are also decreased. While smaller line widths result in a decreased amount of resistance, this decrease is more than offset by an increase resistance due to the longer length of word lines. To date, word line resistance is one of the primary limitations of achieving faster ULSI circuits. A method for decreasing the resistivity of word lines is needed for use in ULSI applications.

In addition to creating a diffusion barrier layer in a two-layer word line stack, another way of decreasing resistance in a word line is by forming a high conductivity film on the word line. Such films are commonly formed of a refractory metal silicide, such as titanium silicide ($TiSi_2$). Titaniun is preferably used as the refractory metal component because it has the ability to reduce oxygen, which remains on surfaces in the form of native oxides. Native oxides are reduced to titanium oxide by titanium. Native oxides degrade interface stability, and often cause device failure if not removed.

However, several problems occur with the use of $TiSi_2$ in ULSI applications. At higher temperatures subsequent processing temperatures, $TiSi_2$ has a tendency to agglomerate into two different phases, C54 and C49, which have different lattice structures. The C54 phase agglomerates at the interfaces between C49-$TiSi_2$ and silicon (or polysilicon). While this is undesirable due to the increased resistance associated with agglomeration, the $TiSi_2$ phase formed at higher temperatures, C54, is more stable and has a much lower resistivity than the C49 metastable phase formed at lower temperatures.

Another problem with using $TiSi_2$ at higher temperatures is that the high-temperature phase, C54, has a grain size typically ranging from 0.3 to over 1.0 microns, which prohibits it from being used in sub-0.25 micron word line applications. However, it is always desirable to form a phase having the lowest free energy at a particular grain size, so that it is the most stable. FIG. 1 illustrates how free energy, $\Delta G_f(\gamma)$, is a function of grain size, r. Free energy, $\Delta G_f(\gamma)$, as a function of grain size, r, is divided into three regions: A, B, and C. The most stable phase at a given grain size is that which has the lowest free energy. Both regions A and B are in the sub-micron range. In the sub-micron range, the free energy of C54 is greater than that of C49, due to the larger surface energy of C54.

In order to use the C54 phase in ULSI circuits, particularly in 256 Megabit DRAMs and other devices requiring sub-0.25 micron line widths, it is necessary that the grain size be reduced, so that it will be more stable. Due to the increased sensitivity of ULSI circuits, it is important to maintain low resistivity in. ULSI devices. There is a need for a stable, low resistivity $TiSi_2$ phase which can be used in sub-0.25 micron word line applications.

SUMMARY OF THE INVENTION

A method for forming a word line, which is used in ultra-large scale integrated (ULSI) circuits, produces a lower resistivity word line than those formed using prior art techniques. A doped silicon diffusion barrier formed in the word line stack prevents diffusion from a bottom silicon layer to a conductor layer in a word line stack, which results in degradation of the word line stack, increasing its resistivity. Oxygen or nitrogen is used for the dopant. Compared to dielectric diffusion barriers, oxygen or nitrogen doped silicon has a significantly lower resistance. Furthermore, such dopants improve the thermal stability of the conductor layer.

According to another aspect of the invention, resistivity is lowered and grain size of the conductor layer is modified using barrier elements to form a low dose matrix in silicon, or polysilicon. Subsequently annealing the word line stack forms a preferential C54-titanium silicide ($TiSi_2$). $C54\text{-}TiSi_2$ is more stable at high temperatures than $C49\text{-}TiSi_2$. Use of $C54\text{-}TiSi_2$ minimizes problems with $C49\text{-}TiSi_2$ agglomerating at higher temperatures. Furthermore, $C54\text{-}TiSi_2$ has a much lower resistivity than $C49\text{-}TiSi_2$. Sub-0.25 micron word lines are able to be silicided with $C54\text{-}TiSi_2$ using the invention, due to modification of $TiSi_2$ grain sizes using the implanted matrix. Previously, the relatively large size of $C54\text{-}TiSi_2$ grains, greater than 0.3 microns, prohibited its use in sub-0.25 micron word line applications.

According to another aspect of the invention, a thin nitride layer is formed at the interface between the bottom silicon layer and the conductor layer. The nitride layer improves high temperature stability of the conductor layer. Thermal stability of the conductor layer is improved because the nitride layer inhibits uncontrollable, massive silicidation, which results from pin holes, or other defect sites at the interface between the conductor layer and the bottom silicon layer. Furthermore, leakage currents are reduced due to the nitride layer. Using the method of the invention for nitriding the conductor layer/bottom silicon layer interface is preferable to using prior art methods of implanting nitrogen at the interface. Implanted nitrogen is plagued by straggle, which causes problems in shallow junction applications.

According to yet another aspect of the invention, an amorphous silicon diffusion barrier is formed between the bottom silicon layer and the conductor layer. The amorphous silicon diffusion barrier improves the thermal stability of the conductor layer and decreases the resistivity of the word line stack by preventing diffusion between the two layers.

DETAILED DESCRIPTION

The following embodiments described in multiple sections are illustrative of various aspects of the invention, but should not be construed as limitations on the scope of the invention, except where specifically noted. Each embodiment describes the formation of a conductor for a semiconductor device which has improved conductive properties. The embodiments each describe a method for forming a word line which is used in ultra-large scale integrated (ULSI) circuits. While each embodiment is described with reference to it being a word line, other conductors may also be formed for various purposes, especially where reduced resistance is needed.

A first embodiment, the forming of diffusion barriers using oxygen or nitrogen in a word line stack is used to prevent diffusion from a bottom silicon layer to a conductor layer. In another embodiment, resistivity is lowered and grain size of the conductor layer is modified using barrier elements to form a low dose matrix in silicon, or polysilicon. Subsequently annealing the word line stack forms a preferential C54-titanium silicide ($TiSi_2$) which is more stable at high temperatures than $C49\text{-}TiSi_2$. In another embodiment of the invention, a thin nitride layer is formed at the interface between the bottom silicon layer and the conductor layer. Thermal stability of the conductor layer is improved because the nitride layer inhibits uncontrollable, massive silicidation, which results from pin holes, or other defect sites at the interface between the conductor layer and the bottom silicon layer. In yet another embodiment of the invention, an amorphous silicon diffusion barrier is formed between the bottom silicon layer and the conductor layer. The amorphous silicon diffusion barrier improves the thermal stability of the conductor layer and decreases the resistivity of the word line stack by preventing diffusion between the two layers. Each embodiment is described in further detail in the following sections.

Doped Silicon Diffusion Region

Figure 2A:
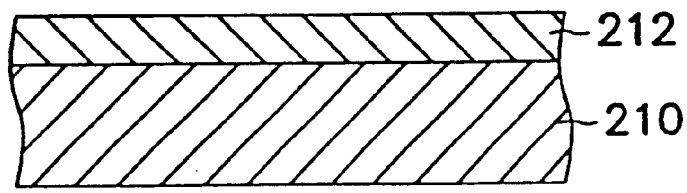
FIGS. 2A–2J are cross-sectional representations of a word line stack formed in accordance with one aspect of the method of the invention.
Figure 2B:
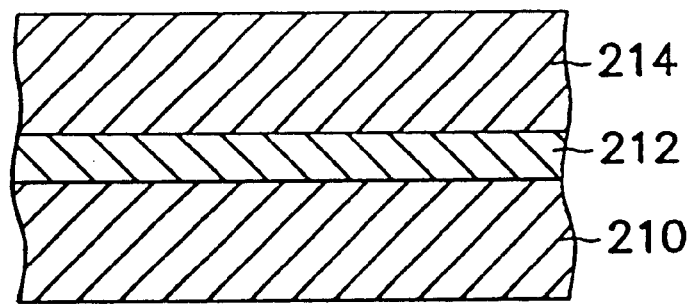

According to one aspect of the invention, a doped silicon diffusion barrier region is formed prior to formation of a conductor layer, and subsequent to formation of a bottom silicon layer, to form a word line stack. In a first embodiment of the invention, a conventional p-type silicon substrate 210 is provided and a conventional (i.e., a thin layer of $SiO_2$) gate oxide layer 212 is grown by standard techniques, as shown in FIG. 2A. After gate oxide 212 growth, a polysilicon (or silicon) "bottom silicon" layer 214 of thickness from approximately 50 to 150 nanometers is deposited on the gate oxide layer 212, as shown in FIG. 2B. This bottom silicon layer 214 is doped with conventional dopants (such as, but not limited to, arsenic, phosphorous, and boron), or it can be a layer of undoped, intrinsic material. Regardless of composition, the bottom silicon layer 214 is manufactured according to known techniques in order to guarantee good electrical properties at the interface between the gate oxide layer 212 and the bottom silicon layer 214.

Figure 2C:
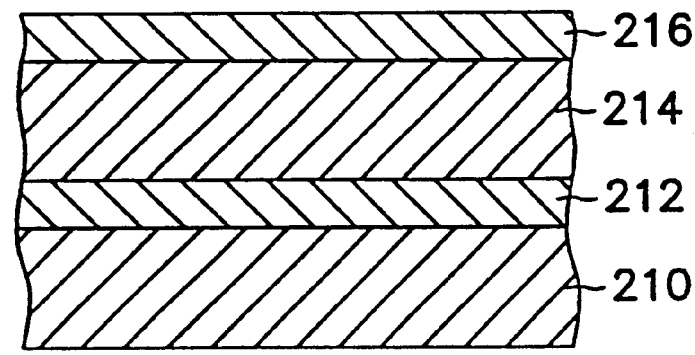

Next, a thin region 216 of oxygen, or nitrogen, doped polysilicon (or silicon) is formed on the bottom layer 214, as shown in FIG. 2C. This "doped silicon" film 216 is formed in one of two ways. The first way is by deposition (either in-situ or non-in-situ), using chemical vapor deposition (CVD). CVD takes on many different forms, including low pressure chemical vapor deposition (LPCVD), ambient pressure chemical vapor deposition (APCVD), and plasma enhanced chemical vapor deposition (PECVD). However, any form of CVD or sputtering can be used. The second way to form the "doped silicon film" 216 is by implantation of oxygen or nitrogen into the exposed surface of the bottom silicon layer 214.

The interface between the bottom silicon layer 214 and the doped silicon region 216 can be abrupt, or gradual, with respect to the oxygen, or nitrogen, distribution, as shown in FIG. 2C. The thickness of the doped silicon region 216 ranges from approximately 5 to 100 nanometers, and the concentration of oxygen, or nitrogen, ranges from approximately $1\times10^{18}$ atoms/cm$^3$ to $5\times10^{21}$ atoms/cm$^3$. However, the required doped silicon region 216 thickness and dopant concentration depend on the total thermal budget of subsequent processes, and are selected according to known principles.

Figure 2D:
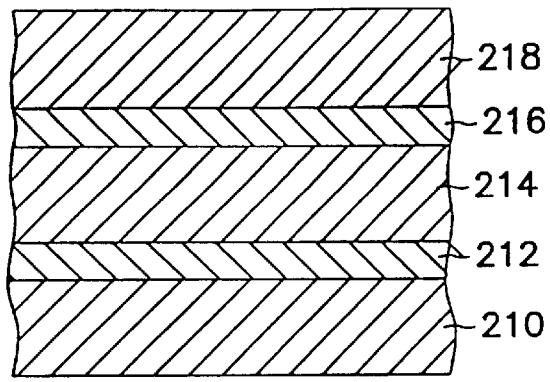

Then, as shown in FIG. 2D, a conductor layer 218 (preferably, but not necessarily, composed of tungsten, titanium silicide (TiSi$_x$), or other conventional materials) of approximately 50 to 200 nanometers thick is deposited on the doped silicon region 216 by conventional techniques, such as sputtering, or CVD. If an intrinsic bottom silicon layer 214 of polysilicon is used, ion implantation of arsenic, phosphorous, or boron is performed after creation of the bottom silicon layer 214, after creation of the doped silicon region 216, or after creation of the conductive layer 218.

The presence of oxygen, or nitrogen, doped polysilicon inhibits silicon diffusion from the bottom polysilicon layer 214 to the conductor layer 218. Furthermore, it improves the thermal stability of the conductor film 218. Compared to a polysilicon film that is not doped with oxygen or nitrogen, the oxygen or nitrogen doped polysilicon film 216 has a higher resistance value. However, compared to a dielectric film, the oxygen or nitrogen doped polysilicon film 216 has a significantly lower resistance, and thus provides good electrical conduction between the conductive layer 218 and the bottom polysilicon layer 214.

Figure 2E:
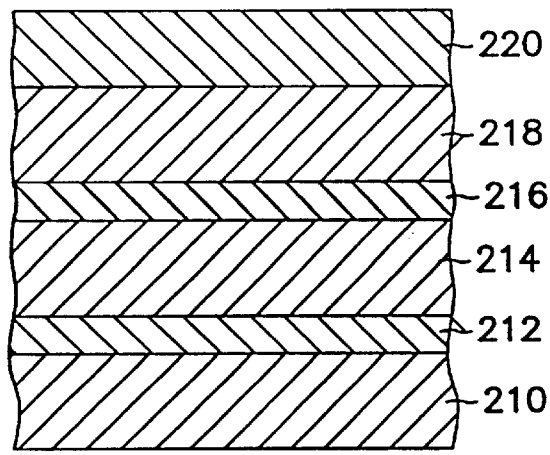
Figure 2F:
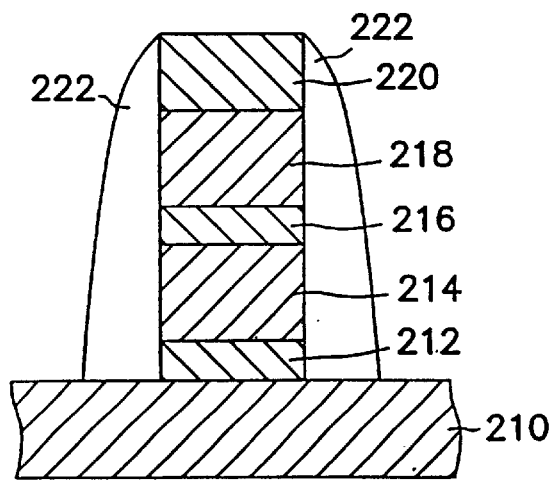
Figure 2G:
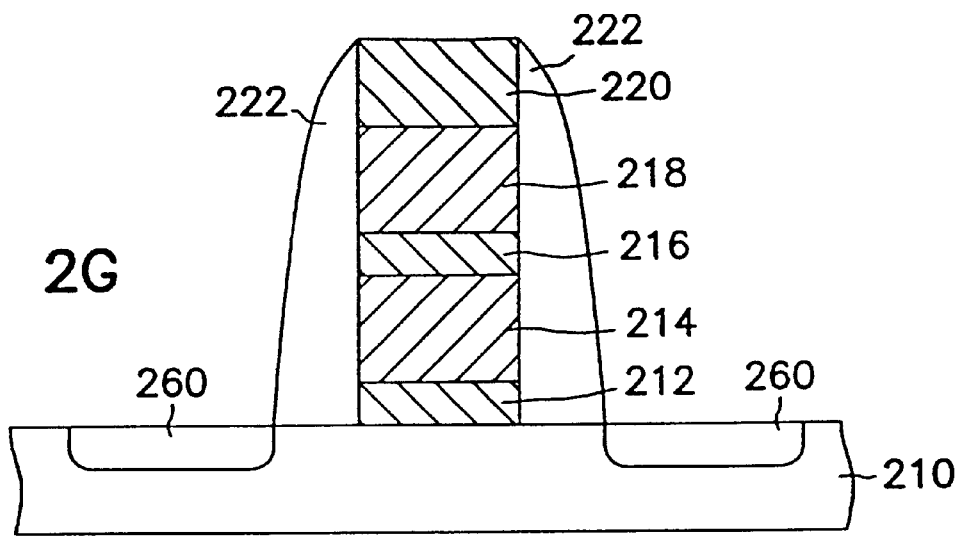

Finally, a cap 220 of one or more dielectric materials, such as silicon oxide or silicon nitride, is formed, if needed, according to conventional techniques, as shown in FIG. 2E. Conventional photo mask and dry etch processes then define a word line stack. After wafer cleaning, spacers 222 are formed alongside the word line stack, as shown in FIG. 2F. Then, source/drain (S/D) implantation forms doped S/D regions 260 aligned with the spacers 222, as. shown in FIG. 2G.

The resultant word line structure comprises: a conductor layer; an oxygen, or nitrogen, doped polysilicon (or silicon) region; and a polysilicon (or silicon) layer. The conductor layer provides low resistivity. The oxygen, or nitrogen, doped layer eliminates (or reduces) agglomeration of the C54-TiSi$_2$ high temperature phase at interfaces between the low temperature C49-TiSi$_2$ and polysilicon (or silicon) during subsequent process heat cycles. The bottom polysilicon (or silicon) layer provides stable gate oxide interface electrical properties.

Figure 2H:
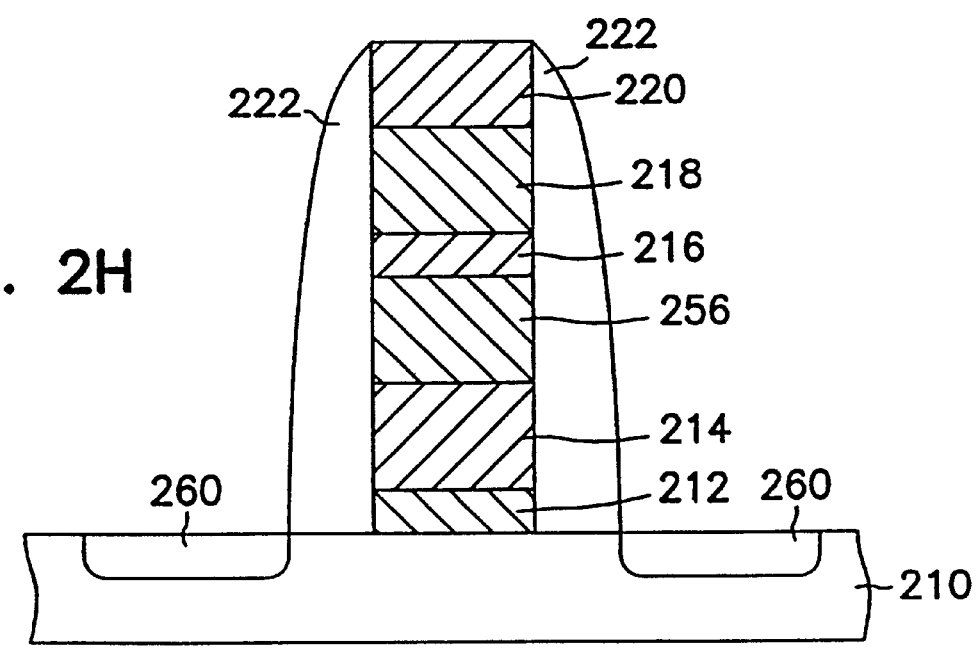
Figure 2I:
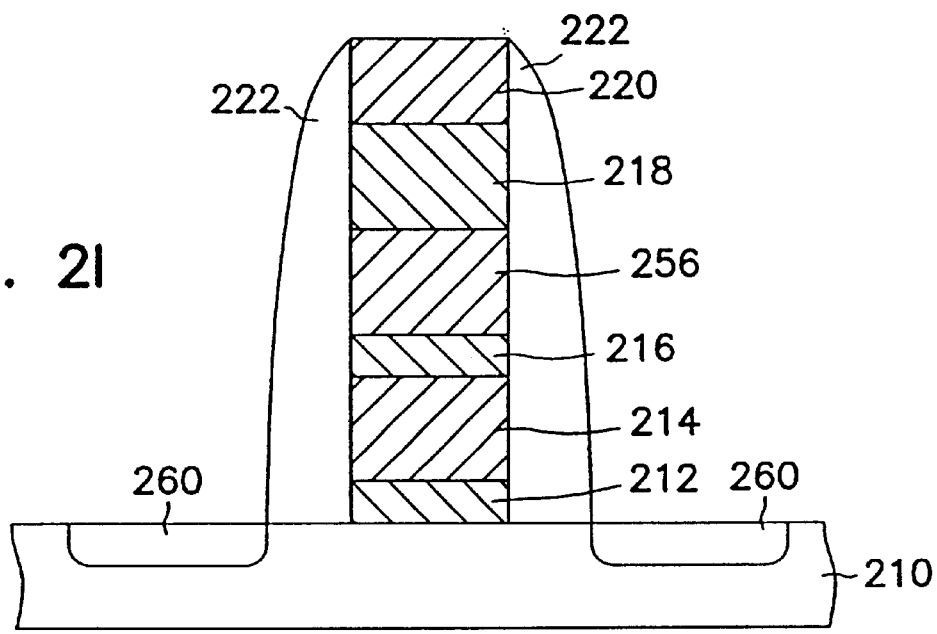

Further embodiments of the invention comprise forming an amorphous silicon diffusion barrier layer 256 prior to, as shown in FIG. 2H, or subsequent to, as shown in FIG. 2I, formation of a doped silicon diffusion barrier region 216. An amorphous silicon diffusion barrier layer is described subsequently under the heading "Amorphous Silicon Diffusion Barrier Layer Formed at Low Temperature."

Figure 2J:
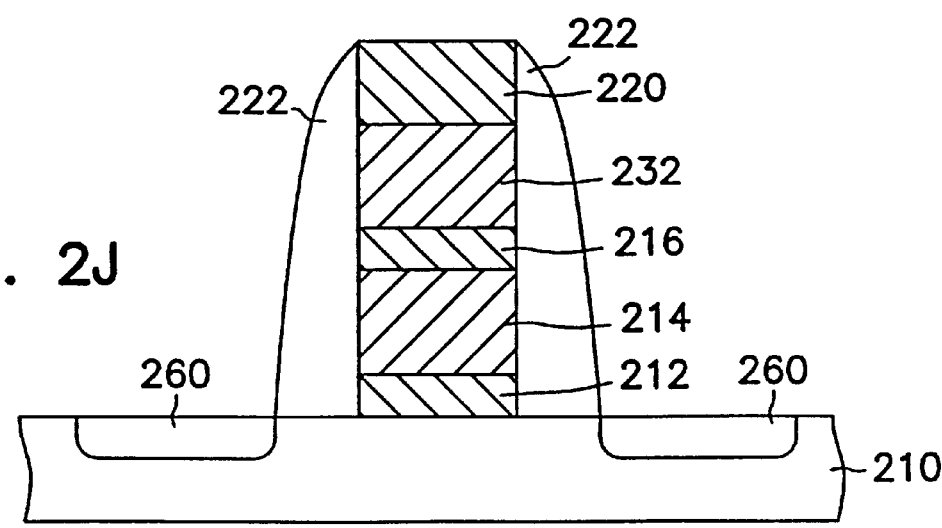

In yet further embodiments of the invention, the conductor layer 232, as shown in FIG. 2J, is formed with a modified grain size, as subsequently described under the heading, "Modification of Conductor Layer Resistivity During Word Line Silicidation." Modifying the grain size of the conductor layer further decreases the resistance of the word line stack.

Modification of Conductor Layer Resistivity During Word Line Silicidation

According to a further aspect of the invention, the resistivity and grain size of the conductor layer, TiSi$_2$, is modified using barrier elements to form a low dose matrix in silicon, or polysilicon, which modifies the C49-TiSi$_2$ phase to C54-TiSi$_2$, increasing chemical and thermal stability. This embodiment is performed subsequent to formation of a bottom silicon layer, and diffusion barrier layers/regions, if any. Diffusion barrier layers/regions of this invention are described under the headings "Doped Silicon Diffusion Region," "Nitridation of Conductor Layer to Improve Thermal Stability," and "Amorphous Silicon Diffusion Barrier Layer Formed at Low Temperature."

This embodiment is advantageous in the formation of sub-0.25 micron word lines. The advantages to using this embodiment are that the conductor layer resistivity is lowered; C54 grain size is modified so that it is finer than the word line width, allowing it to be used in sub-0.25 micron applications; the agglomeration temperature of TiSi$_2$ is increased; and, conventional two-step TiSi$_2$ annealing is potentially condensed into a single step. This invention is crucial in the fabrication of 256 Megabit DRAMs and other devices which require line widths of less than 0.25 microns. As line widths decrease in the low sub-micron range, sheet resistance of titanium silicided polysilicon, or silicon, increases significantly. The agglomeration temperature also decreases with decreasing line width. Agglomeration is unwanted because it causes break-up spots, which lead to device failure.

As is well known in the art, TiSi$_2$ forms various phases. One common phase is the base-centered orthorhombic structure, C49-TiSi$_2$. C49 does not require a two-step annealing process for its formation. Deposited titanium is annealed once, approximately 650 to 750 degrees Celsius, to form the C49 phase. However, use of the C49 phase has many drawbacks. One drawback of the C49 phase is that it has a much higher resistivity (a factor of approximately three) than the face-centered orthorhombic C54 phase. Furthermore, it is a metastable phase, compared to the thermally stable C54 phase. C49 is also an undesirable TiSi$_2$ phase because it has poor self-passivating properties against tetraethyloxysilicate (TEOS) spacer formation and borophosphosilicate glass (BPSG) reflow during subsequent process steps. Furthermore, agglomeration usually occurs at the C49-TiSi$_2$/polysilicon (or Si) interface due to decomposition of C49 at higher temperatures. If the layer comprises the C54 phase, then agglomeration will not occur at higher temperatures.

In comparison, the C54-TiSi$_2$ is a high-temperature bulk phase with low resistivity. It is widely used in metal oxide semiconductor (MOS) device applications, such as silicidation of gates and source/drain regions. The silicide, C54-TiSi$_2$, is usually formed using a two-step annealing process after deposition of titanium on the region to be silicided. Such a region can comprise either polysilicon, or silicon. Traditionally, to form the C54 phase, a two-step annealing process is required. The first annealing step is at a low temperature (approximately 650 to 750 degrees Celsius), in a nitrogen, or argon, ambient. This step forms the high resistivity, metastable phase C49-TiSi$_2$. Next, unreacted titanium (Ti) and titanium nitride (TiN) are removed with a wet etch. The second annealing step comprises a high temperature (approximately 750 to 850 degrees Celsius) anneal in a nitrogen (N$_2$), or argon (Ar), ambient. This step transforms the C49-TiSi$_2$ phase to C54-TiSi$_2$. Due to the undesirable properties of C49-TiSi$_2$, complete phase transformation is crucial. It is also crucial to maintain uniformity of phase, as small, nonstoichiometric areas form between boundaries of C49 and C54 phases. Such nonstoichiometric areas are susceptible to oxide growth during subsequent formation of TEOS spacers, resulting in undesirable high resistivity at such boundary areas.

Figure 1:
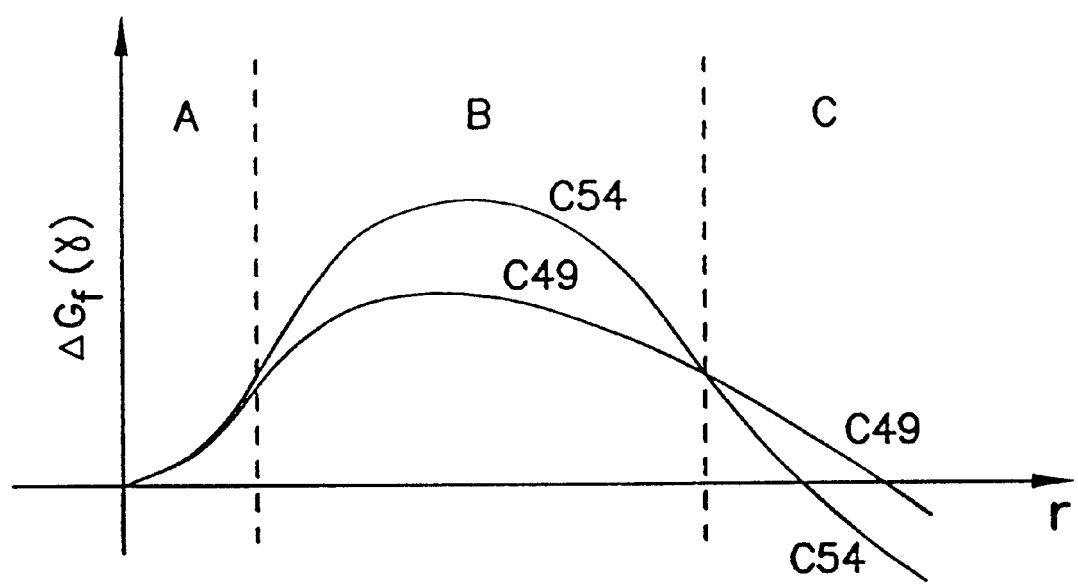
FIG. 1 is a graph illustrating free energy of $C54\text{-}TiSi_2$ and $C49\text{-}TiSi_2$ as a function of grain size.

Thus, this embodiment of the invention forms C54 at sub-micron grain sizes in order to decrease the resistivity of the word line stack due to C54's lower resistivity than C49. As illustrated by FIG. 1, in order to form C54 as a stable phase at sub-micron grain sizes, the total energy of C54 needs to be reduced. One method for decreasing the total energy of C54 is to create an implanted matrix in the polysilicon, or silicon, layer before deposition of titanium. This method is performed subsequent to formation of an oxygen, or nitrogen, doped polysilicon, or amorphous silicon, diffusion barrier region 216, and prior to formation of the conductor layer 218, as shown in FIG. 2D. Various barrier elements form a matrix, which provide nucleation sites and grain boundary stabilizers. The roles of different matrix elements is determined by implanting at low dose levels, in a systematic approach.

For each line width, a process window of implant doses is determined, according to different roles of matrix elements. Such a process window comprises a dose and depth for each line width. Group VIA metals, such as Mo and W, form titanium alloys (e.g., TiW and TiMo) with very low heat of formation. Such alloys are good transition materials between titanium and silicon due to their similar covalent radii. They are able to be formed epitaxially on titanium and silicon surfaces, resulting in a low interface energy due to less broken bonds and lower stress. Therefore, Group VIA elements are good candidates for their roles in creating nucleation sites and their ability to stabilize grain boundaries.

The depth of a matrix depends on the initial titanium layer thickness and the required $TiSi_2$ thickness. Typically, the $TiSi_2$ thickness is below 1,000 angstroms in sub-micron applications. Therefore, a low ion energy implant is utilized.

The dose of a matrix depends on the grain size desired. It is determined using a simple cubic estimation. For example, 0.05 micron grains need $4\times10^{12}$ nucleation sites/cm$^2$ for a 500 angstrom thick matrix. Ion implant elements are uniformly distributed in a substrate with a precise depth. The effectiveness of a given element, therefore, can be determined by implanting a known dose of ions and measuring the resulting C54 grain size. Thus, the invention is not limited to implantation of Group VIA elements, when forming the matrix. Any element can be tested according to the above method to determine whether it is suitable for use as a matrix implant element. A process window is determined by varying the ion dose. A wide range of ion doses should be examined in determining a process window, including low doses of $10^{11}$ to $10^{13}$ cm$^{-2}$. The best candidate for a matrix implant element should have a coalescence threshold (or range).with the highest dose, resulting in the finest grain size.

Certain Group VB nonmetal elements, such as: N, P, As, and Sb, can react with titanium to form barrier materials (e.g., TiN, TiP, TiAs, and TiSb). While such elements increase agglomeration temperature, too many Ti-VB ions at C49-$TiSi_2$/Si (or polysilicon) interfaces hinders transformation of C49 to C54. Group VB elements also have large mismatch covalent radii compared to titanium, particularly As and Sb. This tends to drive the barrier material to the top surface of the $TiSi_2$ film at high temperatures, resulting in agglomeration. High solubility of Group VB in $TiSi_2$ may also affect Group VB element's effectiveness as nucleation sites or boundary stabilizers. However, tests for determining the best matrix implant element can be performed to determine if combining elements of both Group VIA and Group VB is a good choice for a matrix implant element.

Figure 3A:
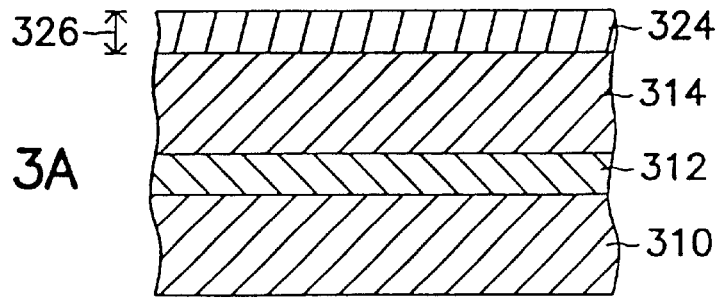
FIGS. 3A–3H are cross-sectional representations of a word line stack formed in accordance with a further aspect of the invention, using a preformed matrix to modify grain size during silicidation.

As shown in FIG. 3A, a polysilicon, or silicon, film 314 is formed over a semiconductor substrate 310 and gate oxide 312. Further embodiments of this invention comprise forming an oxygen, or nitrogen, doped polysilicon, or silicon, diffusion barrier region prior to forming the matrix implant. Next, one Group VIA element, such as W or Mo, is implanted at a low implant energy into the polysilicon, or silicon, layer 314 to a depth 326 according to the determined process window and to a low dose of approximately $5\times10^{11}$ to $1\times10^{14}$ ions/cm$^2$, to form an implanted matrix 324.

Figure 3B:
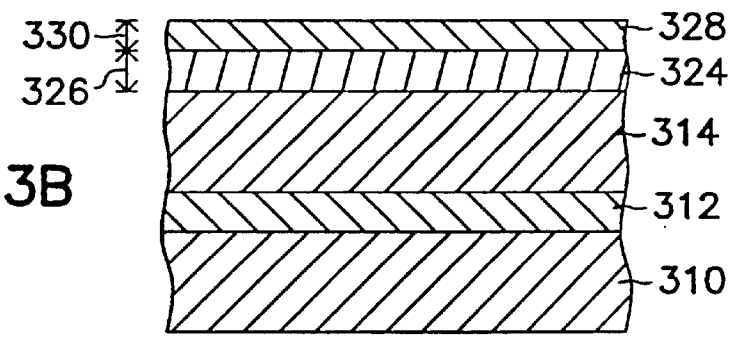
Figure 3C:
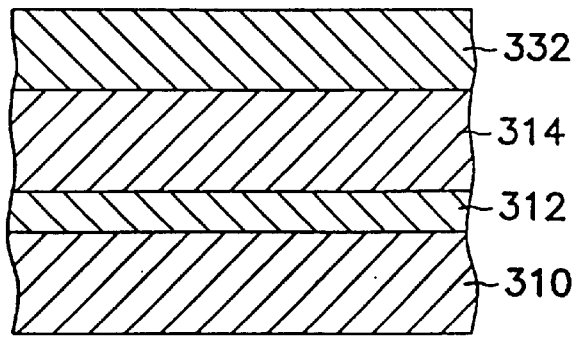

Polycide lines are then formed by depositing titanium 328, as shown in FIG. 3B, on the implanted region, to a depth 330 determined by the desired thickness of $TiSi_2$ and the depth 326 of the matrix. A subsequent anneal forms C54-$TiSi_2$ 332, as shown in FIG. 3C. C54-$TiSi_2$ has a finer grain size than the word line width, on which it is formed. If the process is well-controlled, C49 completely transforms into C54, and there is no need for a second annealing step.

The results of this invention were confirmed using several standard test methods, well known to one skilled in the art. The results obtained from these tests are illustrative of the benefits of the invention, but exact results may vary upon duplication, depending on the equipment and parameters used by one performing the tests. Optical microscope measurements of a $TiSi_2$ conductor layer formed in accordance with the present invention illustrated that a preformed matrix decreases the surface roughness of the resulting $TiSi_2$, resulting from a finer grain size. Measurements were taken, using a 350 angstrom $TiSi_2$ surface for titanium deposited on a preformed polysilicon matrix, comprising Mo at an approximate dose of $1\times10^{14}$ ions/cm$^2$ and for a 350 angstrom $TiSi_2$ surface for titanium deposited on non-implanted (zero matrix) polysilicon. Identical results were obtained using a 500 angstrom $TiSi_2$ surface for titanium deposited on a polysilicon matrix, comprising Mo at an approximate dose of $1\times10^{14}$ ions/cm$^2$ and a 500 angstrom $TiSi_2$ surface for titanium deposited on non-implanted (zero matrix) polysilicon. Identical results were obtained for implanted tungsten (W) preformed matrices.

Results of thermal wave, reflectivity, and JEOL transmission electron microscopy (TEM) measurements are consistent with the data described above. UV 1050 reflectivity measurements show a gradual improvement in reflectivity with increasing dose concentration for preformed W and Mo matrix wafers. Decreasing reflectivity corresponds to decreasing grain sizes, due to a smoother surface. Reflectivity is improved even more dramatically between $TiSi_2$ thicknesses of 300 to 500 nanometers. Parallel results from thermal wave, JEOL, and optical microscope measurements confirm the reflectivity results.

Furthermore, atomic force microscopy (AFM) studies illustrate how $TiSi_2$ grain size and surface morphology change with matrix concentration changes. A 500 angstrom $TiSi_2$ layer was formed on both a zero matrix and a $1\times10^{14}$ Mo ions/cm$^2$ preformed matrix. High resolution AFM reveals that small $TiSi_2$ grains tend to coalesce to form large grains in the case of normal silicidation with a zero matrix. This coalescence results in drastic variation of $TiSi_2$ film thickness, as well as surface roughness. Grain sizes of 0.4 microns or larger, resulting from forming $TiSi_2$ on a zero. matrix, were measured using AFM. These large grain sizes are undesirable in sub-0.25micron word line widths. The result of these measurements is very close to those reported by other non-AFM C54 grain size studies, However, a preformed matrix tends to decrease surface roughness by uniformly nucleating and stabilizing individual $TiSi_2$ grains. Coalescence is drastically reduced for a $1\times10^{14}$ Mo ions/$cm^2$ preformed matrix, resulting in finer grain sizes. This results in more uniform grain size distribution and a much smoother surface.

Figure 3D:
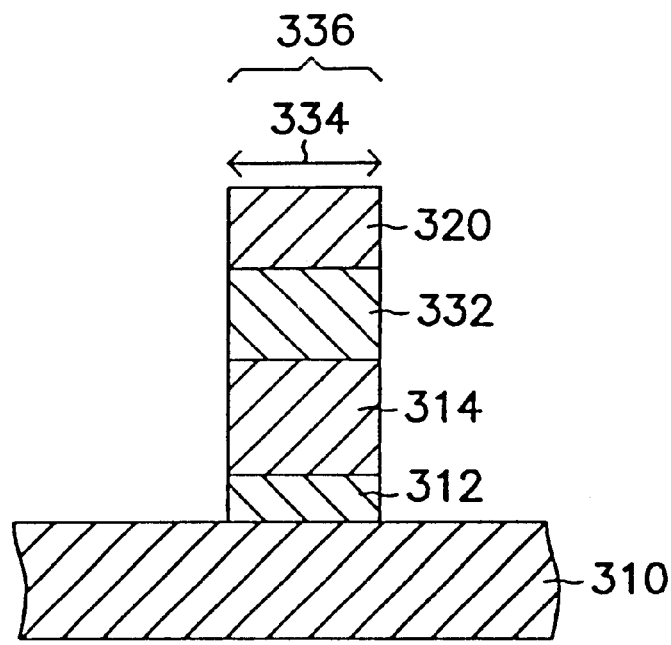
Figure 3E:
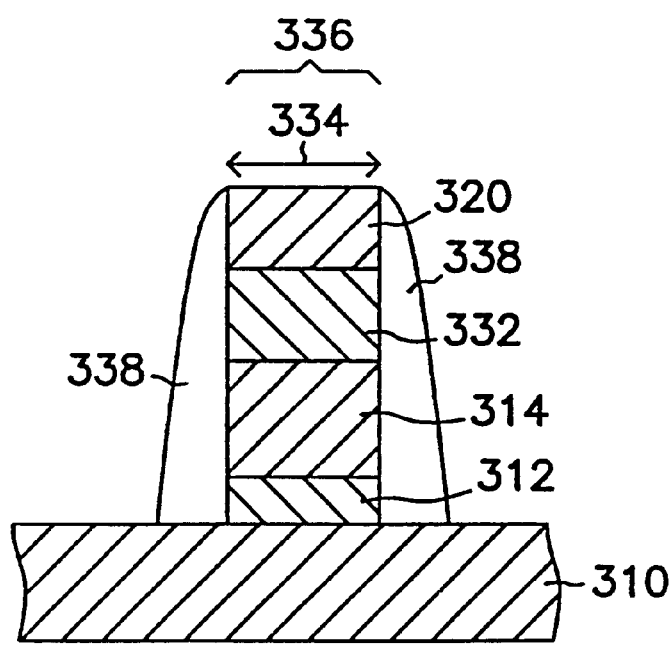
Figure 3F:
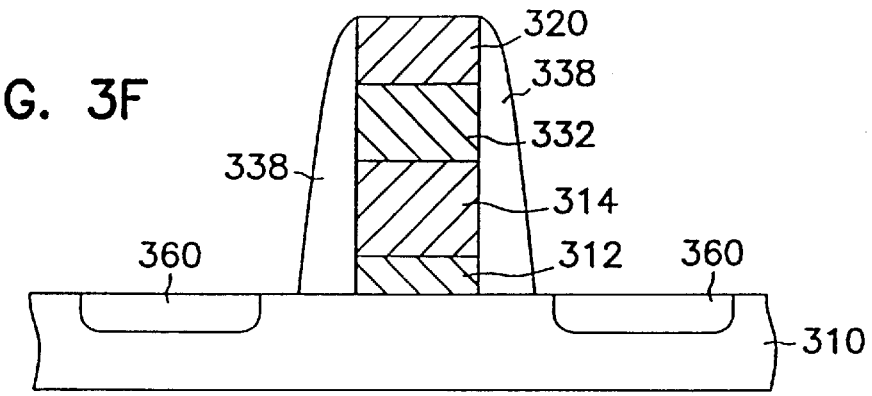

Finally, a cap 320 of one or more dielectric materials, such as silicon oxide or silicon nitride, is applied to the word line stack layers, if needed, according to conventional techniques and shown in FIG. 3D, and the line width 334 is defined by a dry etch, which defines at least one word line stack 336. The width 334 of a word line stack 336 is equal to the line width 334. $TiSi_2$ conductor layers 332 formed in accordance with this embodiment of the invention, comprise the preferred $C54-TiSi_2$ phase, with a grain size finer than that of the line width 334. It is preferable to have $C54-TiSi_2$ for the conductor layer 332, due to its lower resistivity than $C49-TiSi_2$. After wafer cleaning, a spacer 338 is formed, as shown in FIG. 3E, and conventional source/drain (SID) implantation forms doped SID regions 360 aligned with the spacers 338, as shown in FIG. 3F.

Figure 3G:
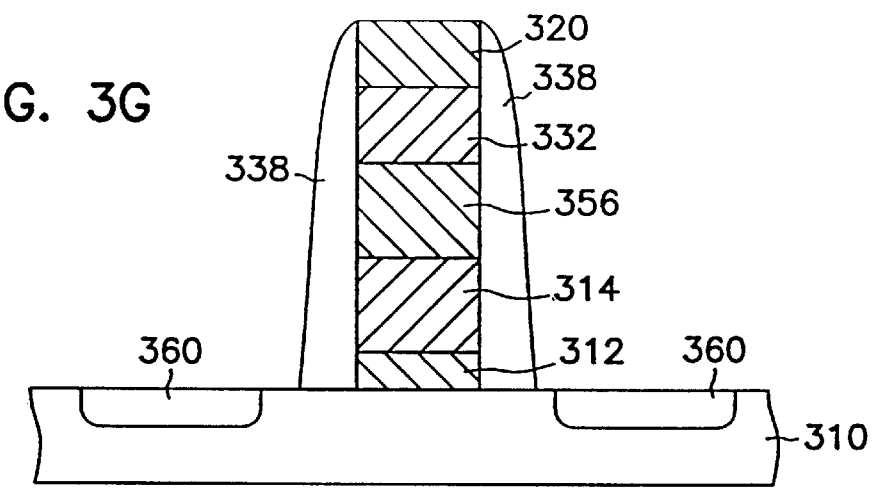
Figure 3H:
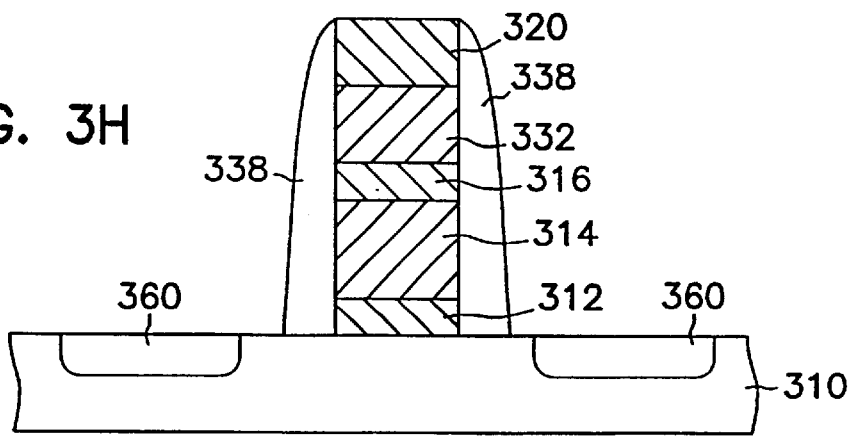

Illustrations for this embodiment of the invention have not shown the oxygen, or nitrogen, doped diffusion barrier regions described in the first example, or amorphous silicon diffusion barrier layers described subsequently. The diffusion barrier region can be formed between the polysilicon, or amorphous silicon, bottom silicon layer 314 and the preformed matrix 324, shown in FIG. 3A. FIG. 3G illustrates an amorphous silicon diffusion barrier layer 356 and FIG. 3H illustrates an oxygen, or nitrogen, doped diffusion barrier region 316. Further embodiments of this invention will be apparent to those skilled in the art.

Nitridation of Conductor Laver to Improve Thermal Stability

Figure 4A:
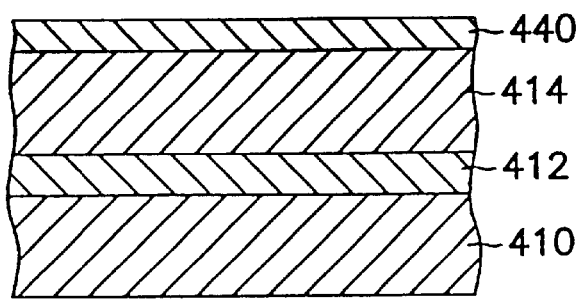
FIGS. 4A–4H are cross-sectional representations of a word line stack formed in accordance with a further aspect of the invention, using light nitridation.

A method of lightly nitriding the $TiSi_2$/Si (or polysilicon) interface through "thin snow-plow" metallization improves high temperature stability of $TiSi_2$. As illustrated in FIG. 4A,. an ultrathin (approximately 20 to 30 angstroms) $SiO_2$ film 440 is grown on the bottom silicon layer 414 of a word line stack, formed over a silicon substrate 410 and gate oxide 412, using rapid thermal oxidation (RTO) processing. For example, using RTO, a thin oxide is grown using an Applied Materials Centura HT (G2) tool in RTO mode. Oxygen is introduced at a pressure of approximately 50 Torr and temperature of approximately 800 and 1,050 degrees Celsius. After approximately 15 to 25 seconds, a 20 to 30 angstrom oxide film 440 is formed. The RTO temperature is reduced if RTO time is increased. These parameters are not meant to be limiting, but are only one way to grow an ultrathin oxide film 440.

Figure 4B:
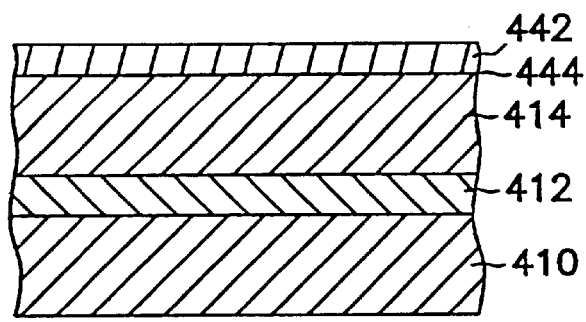

Then, the film 440 is annealed in an $N_2O$, $NH_3$, or NO, ambient, using rapid thermal nitridation (RTN) or plasma nitridation, resulting in a thin film 442, having an increased nitrogen concentration, as shown in FIG. 4B, and a thickness of approximately 20 and 50 angstroms. The nitrogen-containing ambient effectively strengthens thin spots and fills any pin holes, improving uniformity of the oxide film 442. Pin holes, or interface defect sites, are usually sources of uncontrollable, massive silicidation that lead to nonuniform growth of $TiSi_2$. Nonuniform growth of $TiSi_2$ results in a undesirable, higher resistivity silicide film.

The key to obtaining a low resistivity $TiSi_2$ film using this approach, is to have a flat, thin "snow-plow," as described below. A "snow plow" starts with a thin film 442 (approximately less than 20 to 50 angstroms), having a low nitrogen concentration (approximately $10^{13}$ $cm^{-2}$) primarily at the $SiO_2$/Si (or polysilicon) interface 444, as shown in FIG. 4B. When the RTN step is performed at a temperature of approximately 800 and 1,050 degrees Celsius, the concentration of nitrogen atoms at the $SiO_2$/Si interface 444 is approximately 1.4% N atoms by volume when using a $N_2O$ ambient and approximately 5.4% N atoms by volume when using a NO ambient. The nitrogen concentration in the film 442 can be determined by a film reflex index. A lower nitrogen content is obtained by varying the annealing temperature and ambient gas used. A higher nitrogen content is achievable by annealing in an ammonia, $NH_3$ ambient. However, usually, only a very low nitrogen concentration is needed at the $SiO_2$/Si interface 444 because too much nitrogen content can inhibit subsequent silicidation.

Figure 4C:
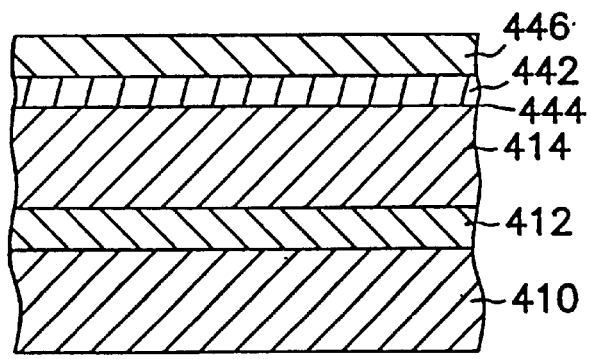
Figure 4D:
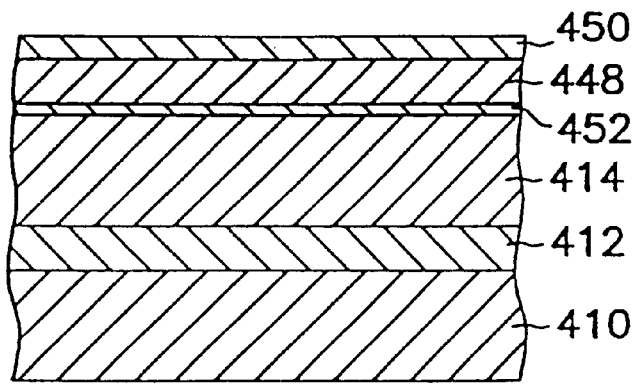

Subsequently, a $TiSi_2$ film is grown by depositing a titanium layer 446, as shown in FIG. 4C, onto the exposed side of the nitrogen-containing $SiO_2$ film 442 and annealing. The thickness of the titanium layer 446 depends on the application, but is typically approximately 400 to 1,500 angstroms. During $TiSi_2$ growth, titanium 446 reduces the oxygen contained in the $SiO_xN_y$ layer 442. As $TiSi_2$ 448 is formed, and the $TiSi_2$ 448 boundary advances, reduced oxygen atoms 450 (i.e., $TiO_x$) are "snow-plowed" towards an outer $TiSi_2$ 448 surface due to more favorable $TiSi_2$ 448 formation, as shown in FIG. 4D. The thickness of the titanium oxide layer 450 formed is not critical, because it is later stripped away, but is typically approximately 5% of the thickness of the titanium silicide layer 448 formed. The "thin snow-plow" phenomenon produces a high quality $TiSi_2$ film 448. The titanium silicide film is approximately 400 to 3,000 angstroms thick. In general, it is typically approximately 2 to 3 times the thickness the orginal layer of deposited titanium 446. Only a light nitride layer 452 remains at the $TiSi_2$/Si (or polysilicon) interface, having a thickness of approximately a few atomic layers.

Thermal stability of $TiSi_2$ is greatly improved by forming a light nitride layer in accordance with this embodiment of the invention. Word lines formed in accordance with this method are thermally-stable, up to 200 to 300 degrees Celsius more so than those formed using prior art techniques. However, there is a trade off for improving the thermal stability of a word line using a thin nitride layer. The nitride layer increases the resistivity of the word line. However, resistivity of the resulting film is usually no more than a factor of two larger than conventional salicided $TiSi_2$. Furthermore, this method effectively lowers leakage currents. This method is highly advantageous over implanting nitrogen into the silicon substrate to form a nitride layer. Since nitrogen is a light element, projected straggle during implantation is quite large, even at shallow implantations (i.e., approximately 200 angstroms for a 20 keV implant). Light nitridation using implantation occurs at least in a range of several hundred angstroms. This potentially causes problems for future shallow junction applications.

Figure 4E:
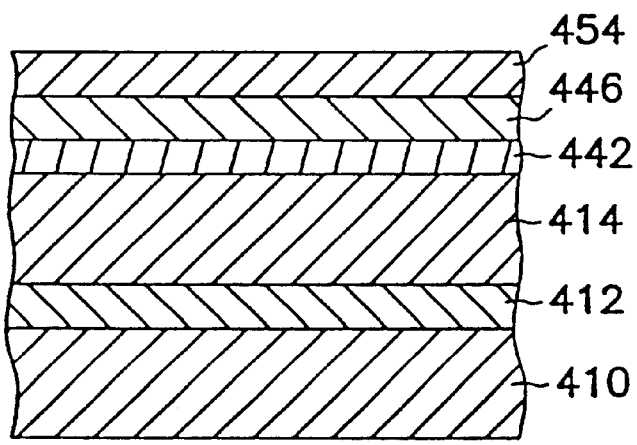
Figure 4F:
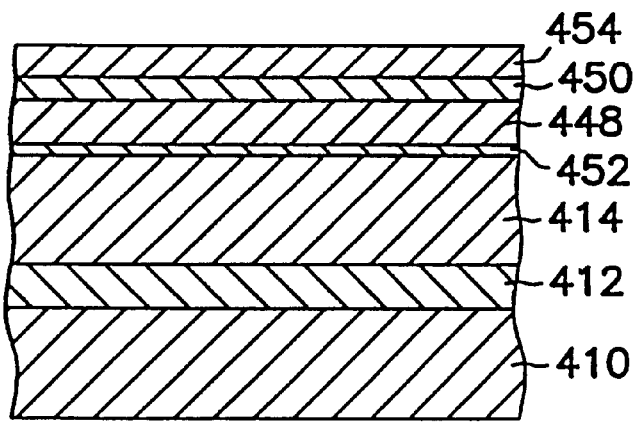
Figure 4G:
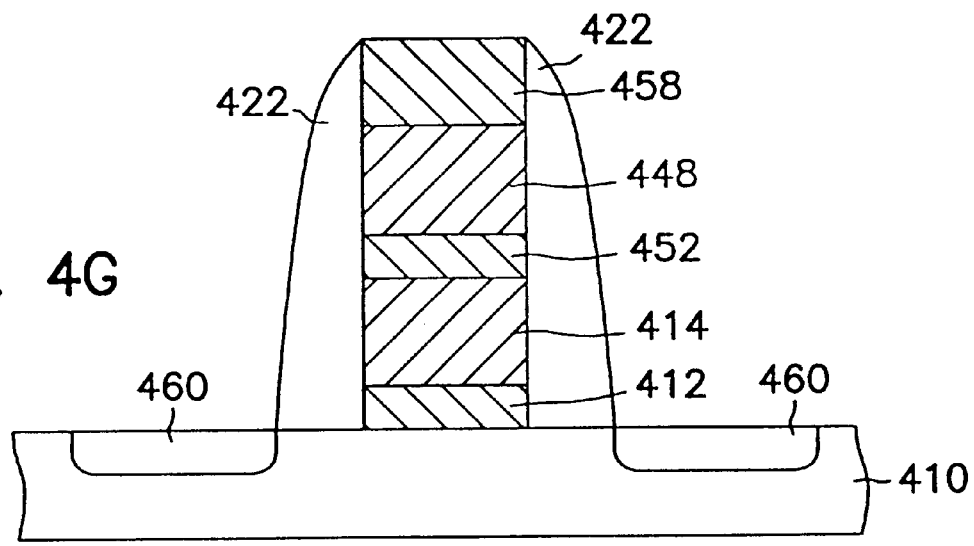

Subsequent to deposition of titanium 446 and prior to annealing to form $TiSi_2$, a titanium nitride (TiN) cap 454 is formed in a further embodiment of the invention, as shown in FIG. 4E. Such a layer 454 is typically approximately 25 nanometers thick, deposited using PVD. As the $TiSi_2$ 448 boundary advances, reduced oxygen atoms 450 (i.e., $TiO_x$) are "snow-plowed" towards the outer $TiSi_2$ 448 surface due to more favorable $TiSi_2$ 448 formation, as shown in FIG. 4F. This "thin snow-plow" phenomenon produces a high quality $TiSi_2$ film 448. Only a light nitridation layer 452 remains at the $TiSi_2$/Si (or polysilicon) interface. The TiN cap 454 remains interposed on the outside surface of the word line stack. The TiN cap 454 and the $TiO_x$ layer 450 can then be stripped away with a suitable acid. Subsequent process steps comprise depositing a cap dielectric 458, such as silicon oxide or silicon nitride, and etching to define a word line stack and forming oxide spacers 422 alongside the word line stack, as shown in FIG. 4G. Conventional source/drain implantation forms implanted regions 460 self-aligned with the oxide spacers 422.

Figure 4H:
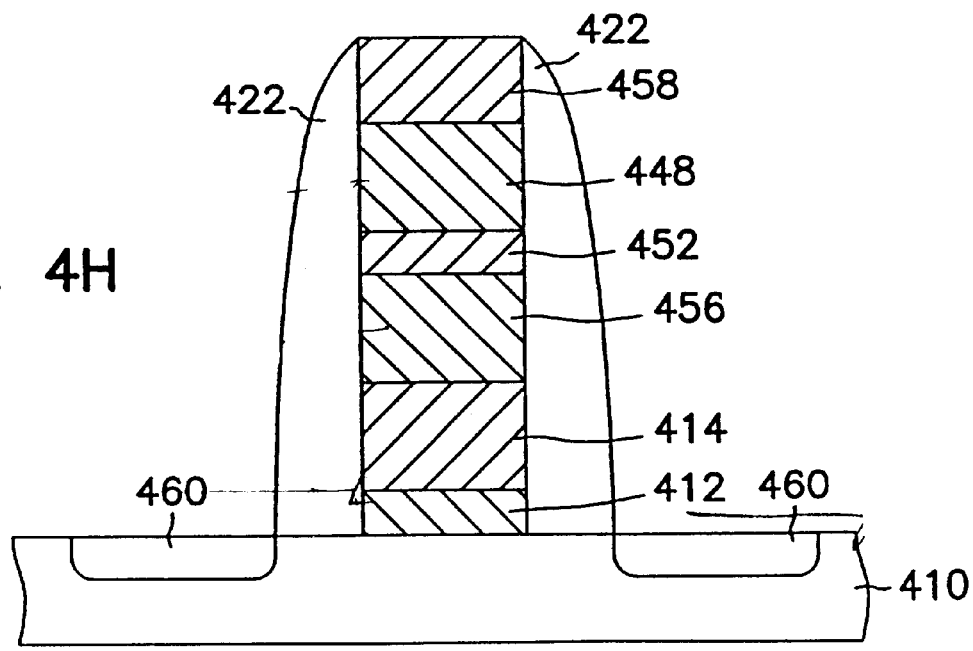

According to another aspect of the invention, a conductor layer 448 is nitrided during fabrication of a word line stack, subsequent to formation of a bottom silicon layer 414 and amorphous silicon diffusion barrier layer 456, as shown in FIG. 4H, to form a word line stack with improved thermal stability. An amorphous silicon diffusion barrier layer 456 is described subsequently under the heading "Amorphous Silicon Diffusion Barrier Layer Formed at Low Temperature." In further embodiments of the invention, the conductor layer 448 is subsequently formed with a modified grain size, as previously described under the heading, "Modification of Conductor Layer Resistivity During Word Line Silicidation." Modifying the grain size of the conductor layer 448 further decreases the resistance of the word line stack.

Amorphous Silicon Diffusion Barrier Layer Formed at Low Temperature

As shown in FIGS. 5A to 5I, in order to improve the thermal stability of the $TiSi_2$ conductor layer 548 and maintain its low resistivity, a further embodiment of the invention comprises forming an amorphous silicon layer 556 on the bottom silicon layer 514. In this embodiment, the bottom silicon layer 514 comprises polysilicon. An amorphous silicon layer 556 interposed between the polysilicon layer 514 and the conductor layer 548 prevents silicon from the polysilicon layer 514 from migrating into the conductor layer 548, where it reacts to form higher resistivity titanium silicide.

Figure 5A:
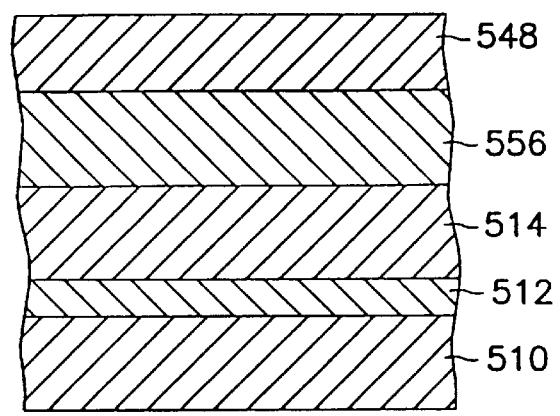
FIGS. 5A–5H are cross-sectional representations of a word line stack formed in accordance with a further aspect of the invention, having a non-nucleus amorphous silicon diffusion barrier layer.
Figure 5B:
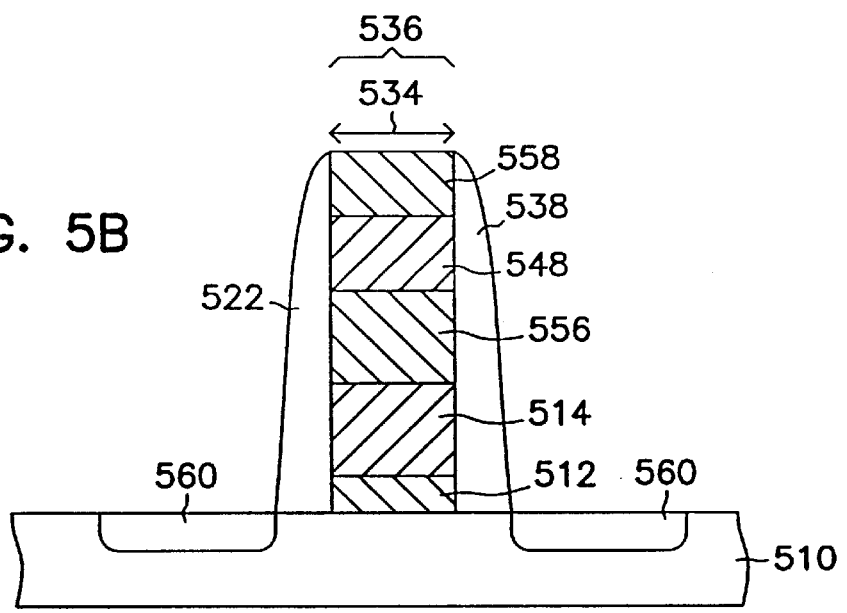

A structure employing non-nucleus amorphous silicon adjacent to polysilicon is constructed, as shown in FIG. 5A. The structure comprises (from the top down): a 1,000–1,500 angstrom thick, conventional $TiSi_x$ (x=2.2) conductive layer 548; an approximately 750 angstrom thick, in-situ doped amorphous silicon layer 556; an approximately 750 angstrom thick, conventional polysilicon layer 514; a conventional gate oxide layer 512; and a conventional p-doped silicon substrate 510. A substrate 510 is provided by conventional techniques. A gate oxide layer 512 is formed upon the substrate 510 using conventional techniques. Then, a polysilicon layer 514 is formed on the gate oxide layer 512, opposite the substrate 510, again by conventional techniques. An amorphous silicon layer 556 is deposited in a low pressure chemical vapor deposition (LPCVD) furnace at about 500 degrees Celsius. Subsequently, a conductor layer 548 is formed using conventional sputtering techniques.

High resolution transmission electron microscopy (HRTEM) studies of the amorphous silicon layer indicate that the silicon is a non-nucleus material. In similar structures in which the silicon layer is not present, cyclic annealing of the structure tends to produce columnar grain structures in the polysilicon layer which lead to massive silicon segregation towards the $TiSi_x$ layer. This contributes to agglomeration and surface roughness of the $TiSi_x$. By placing an amorphous silicon layer between the polysilicon layer and the conductor layer, silicon does not migrate into the conductor layer.

When the structure is subjected to heat cycles, one long cycle (approximately 800 degrees Celsius for 30 minutes) and three short cycles (each cycle approximately 1,000 degrees Celsius for 20 seconds), the sheet resistance of the 1,000–1,500 angstrom thick, sputtered $TiSi_x$ film is approximately less than 1.5 ohms/□. Atomic force microscopy (AFM) studies indicate that the peak-to-valley measurement of the $TiSi_x$ is less than 16 nanometers, and the STD roughness is less than about 30 angstroms.

Subsequent processing steps are similar to those used in other embodiments of the invention. A cap of one or more dielectric materials, such as silicon oxide or silicon nitride 558, is applied to the word line stack layers, if needed and shown in FIG. 5B, according to conventional techniques. Subsequently, the line width 534 is defined by a dry etch, which defines at least one word line stack 536. The width 534 of a word line stack 536 is equal to the line width 534. After wafer cleaning, a spacer 538 is formed and conventional source/drain (S/D) implantation forms doped S/D regions 560 self-aligned with the spacers 538.

Figure 5C:
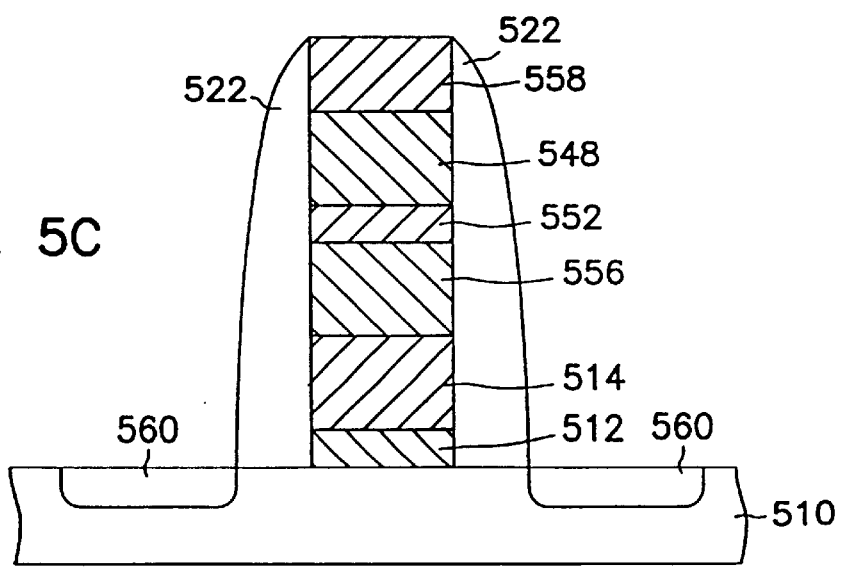
Figure 5D:
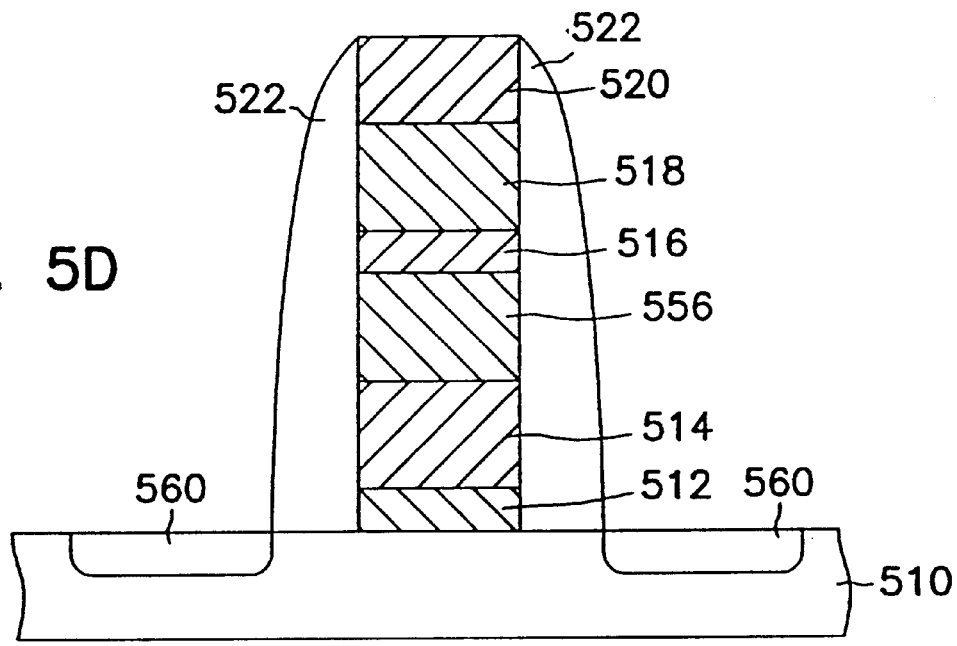
Figure 5E:
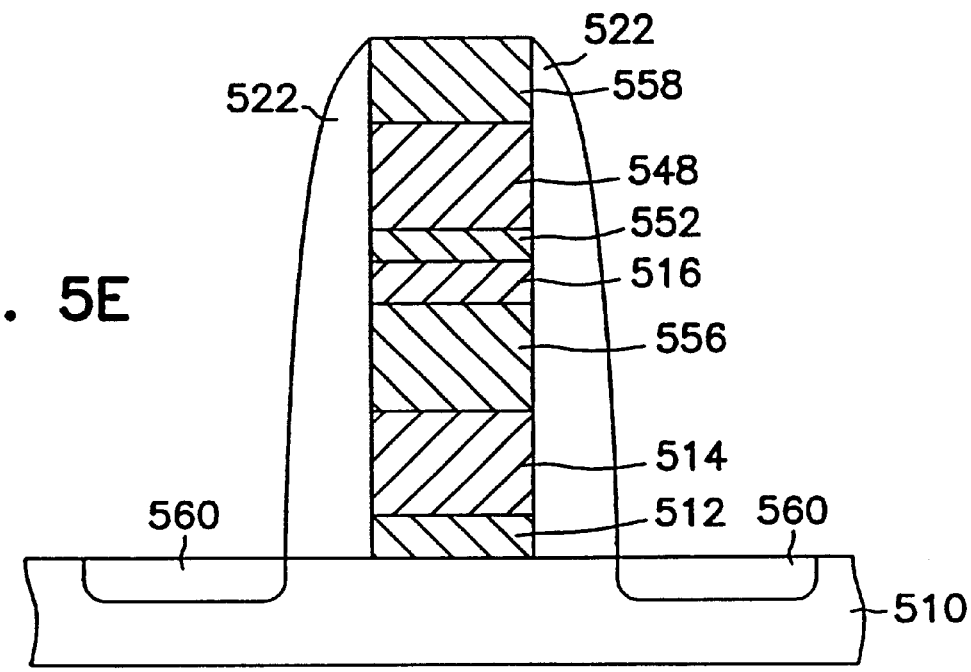
Figure 5F:
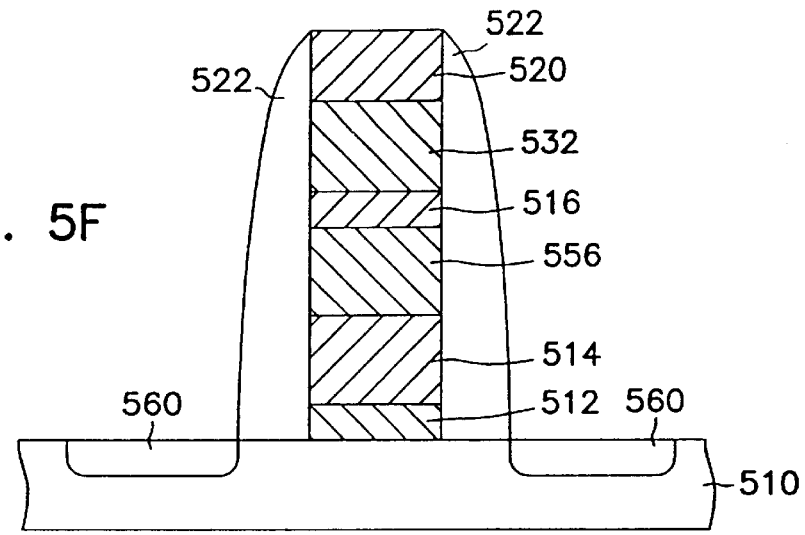
Figure 5G:
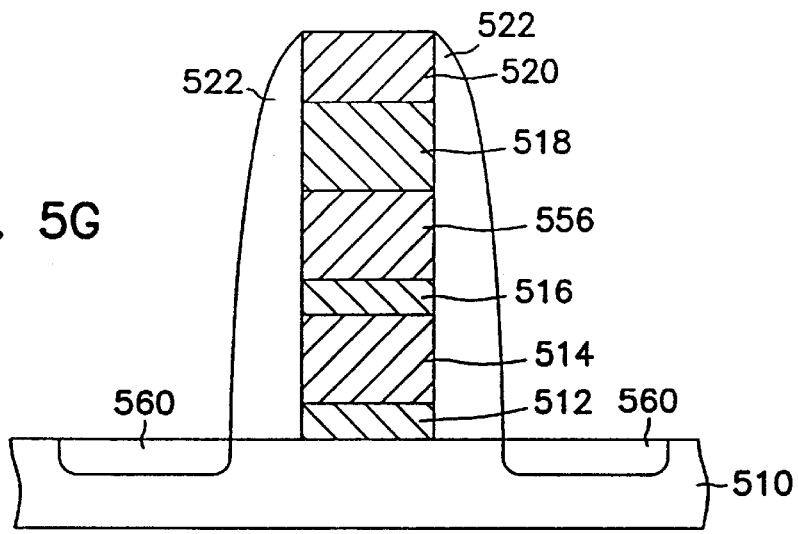
Figure 5H:
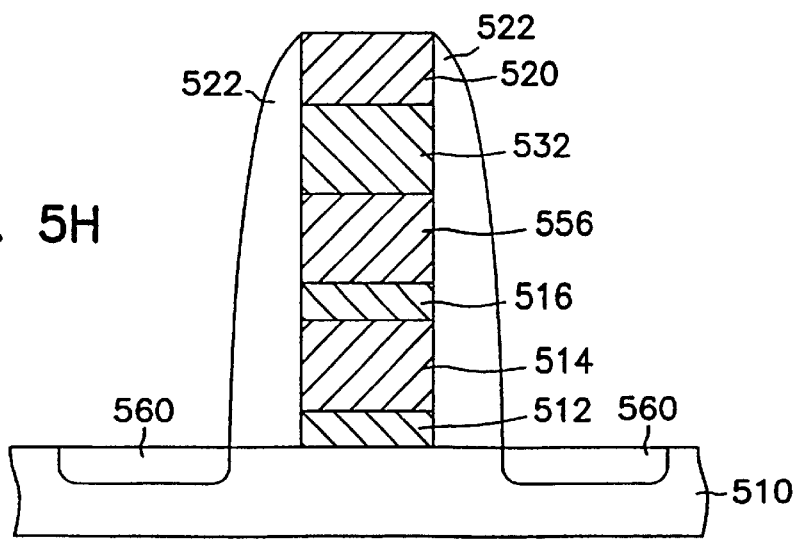

In a further embodiment of the invention, the conductor layer 548 is formed with a thin nitrided layer 552, as previously described using a snowplow method and shown in FIG. 5C. In another embodiment, an oxygen, or nitrogen, doped diffusion barrier region 516 is formed subsequent to the amorphous silicon diffusion barrier layer 556, as shown in FIG. 5D. Furthermore, the conductor layer 548 is formed by the snowplow method described previously, to form a nitride layer 552 between the conductor layer 548 and the doped diffusion barrier region 516, as shown in FIG. 5E. A dielectric cap 558 completes the word line stack. In a further embodiment, the $TiSi_2$ conductor layer 518 formed in accordance with this embodiment of the invention, comprises the $C54-TiSi_2$ phase, as shown by layer 532 in FIG. 5F, with a grain size finer than that of the line width 534. The method for forming the $C54-TiSi_2$ phase conductor layer 548 was described previously. It is preferable to have $C54-TiSi_2$ for the conductor layer 548 due to its lower resistivity than $C49-TiSi_2$. In yet another embodiment, an oxygen, or nitrogen, doped diffusion barrier region 516 is formed prior to the amorphous silicon diffusion barrier layer 556, as shown in FIG. 5G. The conductor layer 518 is modified to form the $C54-TiSi_2$ phase for a lower resistivity conductor layer 532, as shown in FIG. 5H.

Conclusion

Numerous further embodiments will be apparent to one skilled in the art. Different embodiments of the invention can be applied simultaneously to further decrease the resistivity of a word line. For example, a doped silicon diffusion barrier is formed in conjunction with an amorphous silicon diffusion barrier in one further embodiment. An implanted matrix, which forms the preferential conductor layer phase, $C54-TiSi_2$, is used in conjunction with the doped silicon diffusion barrier in another further embodiment. The amorphous silicon diffusion barrier is formed in conjunction with nitriding the conductor layer in yet a further embodiment. The amorphous silicon diffusion barrier is formed in yet.a further embodiment in conjunction with an implanted matrix, which forms the preferential conductor layer phase, $C54-TiSi_2$. Furthermore, the conductor layer is nitrided in conjunction with the preferential conductor layer phase, $C54-TiSi_2$, in another further embodiment.

The above described embodiments are examples only, and are not meant to be read in a limiting sense. While the invention has been described for use in the formation of low resistivity word line structures, other conductive structures, such as column lines or other conductors between components on a chip may be formed using the invention.

We claim:

1. A method of manufacturing a semiconductor device on a semiconductor layer, comprising the steps of:
   forming an oxide layer on the semiconductor layer;
   forming a silicon layer on the oxide layer, wherein the silicon layer is selected from the group consisting of intrinsic polysilicon, intrinsic silicon, doped silicon, and doped polysilicon;
   forming a diffusion barrier region in the silicon layer by introducing into the silicon layer at least one dopant selected from the group consisting of:
      (1) oxygen, and
      (2) nitrogen
   such that the dopant introduced into the diffusion barrier region has a concentration of approximately $1 \times 10^{18}$ to $5 \times 10^{21}$ atoms/cm$^3$;
   forming an implanted matrix in the diffusion barrier region, wherein the implanted matrix is implanted with an element selected from the group consisting of: a Group VIA element and a combination of Group VIA and VB elements;
   depositing titanium on the diffusion barrier region; and
   annealing to form C-54 titanium silicide.

2. A method of manufacturing a semiconductor device on a semiconductor layer, comprising the steps of:
   forming an oxide layer on the semiconductor layer;
   forming a polysilicon layer on the oxide layer;
   forming a non-nucleus silicon layer on the polysilicon layer;
   forming a diffusion barrier region in the non-nucleus silicon layer by introducing into the non-nucleus silicon layer at least one dopant selected from the group consisting of:
      (1) oxygen, and
      (2) nitrogen
   such that the dopant introduced into the diffusion barrier region has a concentration of approximately $1 \times 10^{18}$ to $5 \times 10^{21}$ atoms/cm$^3$;
   forming an implanted matrix in the diffusion barrier region,. wherein the implanted matrix is implanted with an element selected from the group consisting of: a Group VIA element and a combination of Group VIA and VB elements;
   depositing titanium on the diffusion barrier region; and
   annealing to form C-54 titanium silicide.

3. A method of manufacturing a semiconductor device on a semiconductor layer, comprising the steps of:
   forming an oxide layer on the semiconductor layer;
   forming a polysilicon layer on the oxide layer;
   forming a non-nucleus silicon layer on the polysilicon layer;
   forming a diffusion barrier region in the non-nucleus silicon layer by introducing into the non-nucleus silicon layer at least one dopant selected from the group consisting of:
      (1) oxygen, and
      (2) nitrogen
   such that the dopant introduced into the diffusion barrier region has a concentration of approximately $1 \times 10^{18}$ to $5 \times 10^{21}$ atoms/cm$^3$; and
   forming a conductor layer on the diffusion barrier region.

4. A method of manufacturing a semiconductor device on a semiconductor layer, comprising the steps of:
   forming an oxide layer on the semiconductor layer;
   forming a silicon layer on the oxide layer, wherein the silicon layer is selected from the group consisting of intrinsic polysilicon, intrinsic silicon, doped silicon, and doped polysilicon;
   forming a diffusion barrier region in the silicon layer by introducing into the silicon layer at least one dopant selected from the group consisting of:
      (1) oxygen, and
      (2) nitrogen
   such that the dopant introduced into the diffusion barrier region has a concentration of approximately $1 \times 10^{18}$ to $5 \times 10^{21}$ atoms/cm$^3$;
   forming a layer of non-nucleus silicon on the diffusion barrier region;
   forming an implanted matrix in the layer of non-nucleus silicon, wherein the implanted matrix is implanted with an element selected from the group consisting of: a Group VIA element and a combination of Group VIA and VB elements;
   depositing titanium on the non-nucleus silicon; and
   annealing to form C-54 titanium silicide.

5. A method of manufacturing a semiconductor device on a semiconductor layer, comprising the steps of:
   forming an oxide layer on the semiconductor layer;
   forming a silicon layer on the oxide layer;
   forming a diffusion barrier region in the silicon layer by introducing into the silicon layer at least one dopant selected from the group consisting of:
      (1) oxygen, and
      (2) nitrogen
   such that the dopant introduced into the diffusion barrier region has a concentration of approximately $1 \times 10^{18}$ to $5 \times 10^{21}$ atoms/cm$^3$;
   forming a layer of non-nucleus silicon on the diffusion barrier region; and
   forming a conductor layer on the layer of non-nucleus silicon.

6. A method of manufacturing a semiconductor device on a semiconductor layer, comprising the steps of:
   forming an oxide layer on the semiconductor layer;
   forming a polysilicon layer on the oxide layer;
   forming a non-nucleus silicon layer on the polysilicon layer;
   forming an implanted matrix in the non-nucleus silicon layer, wherein the implanted matrix is implanted with an element selected from the group consisting of: a Group VIA element and a combination of Group VIA and VB elements;
   depositing titanium on the non-nucleus silicon layer; and
   annealing to form C-54 titanium silicide.

7. A method for forming a conductor layer in a semiconductor structure, comprising the steps of:
   providing a bottom silicon layer;
   forming a nitrogen-doped silicon oxide film on the bottom silicon layer;
   depositing titanium onto the nitrogen-doped silicon oxide film; and
   annealing the structure to form a titanium silicide conductor layer.

8. The method of claim 7, wherein the nitrogen-doped silicon oxide film has a thickness of approximately 20 to 50 angstroms.

9. The method of claim 7, wherein the method of forming the nitrogen-doped silicon oxide film comprises the steps of:

forming a silicon oxide film; and annealing the silicon oxide film in a nitrogen-containing ambient.

10. The method of claim 9, wherein the nitrogen-containing ambient comprises at least one of the following:
(1) $N_2O$,
(2) NO, and
(3) $NH_3$.

11. The method of claim 9, wherein the annealing step comprises using a method, selected from the group comprising rapid thermal nitridation and plasma nitridation, at a temperature of approximately 800 and 1,050 degrees Celsius.

12. The method of claim 7, wherein the bottom silicon layer is selected from the group comprising: intrinsic silicon, intrinsic polysilicon, doped silicon, and doped polysilicon.

13. A method for forming a conductor layer in a semiconductor structure, comprising the steps of:

providing a bottom silicon layer;

forming a diffusion barrier region in the bottom silicon layer by introducing into the bottom silicon layer at least one dopant selected from the group consisting of:
(1) oxygen, and
(2) nitrogen;

forming a nitrogen-doped silicon oxide film on the diffusion barrier region;

depositing titanium onto the nitrogen-doped silicon oxide film; and annealing the structure to form a titanium silicide conductor layer.

14. A method for forming a conductor layer in a semiconductor structure, comprising the steps of:

providing a bottom silicon layer;

forming a diffusion barrier region in the bottom silicon layer by introducing into the bottom silicon layer at least one dopant selected from the group consisting of:
(1) oxygen, and
(2) nitrogen;

forming a nitrogen-doped silicon oxide film on the diffusion barrier region;

forming an implanted matrix in the nitrogen-doped silicon oxide film, wherein the implanted matrix is implanted with an element selected from the group consisting of: a Group VIA element and a combination of Group VIA and VB elements;

depositing titanium on the nitrogen-doped silicon oxide film; and annealing the structure to form a titanium silicide conductor layer.

15. A method for forming a conductor layer in a semiconductor structure, comprising the steps of:

providing a bottom silicon layer;

forming a nitrogen-doped silicon oxide film on the bottom silicon layer;

forming an implanted matrix in the nitrogen-doped silicon oxide film;

depositing titanium on the bottom silicon layer; and annealing the structure to form a titanium silicide conductor layer.

16. A method for forming a conductor layer in a semiconductor structure, comprising the steps of:

providing a polysilicon layer;

forming a non-nucleus silicon layer on the polysilicon layer;

forming a nitrogen-doped silicon oxide film on the non-nucleus silicon layer;

forming an implanted matrix in the nitrogen-doped silicon oxide film;

depositing titanium on the bottom silicon layer; and annealing the structure to form a titanium silicide conductor layer.

17. A method for forming a conductor layer in a semiconductor structure, comprising the steps of:

providing a polysilicon layer;

forming a non-nucleus silicon layer on the polysilicon layer;

forming a nitrogen-doped silicon oxide film on the non-nucleus silicon layer; and forming a conductor layer on the nitrogen-doped silicon oxide film.

* * * * *